United States Patent [19]
Hileman et al.

[11] Patent Number: 5,680,296
[45] Date of Patent: Oct. 21, 1997

[54] CARD GUIDE WITH GROOVE HAVING A BASE PORTION AND RAMPED PORTION WHICH RESTRAINS AN ELECTRONIC CARD

[75] Inventors: Vince Hileman; Kenneth Kitlas, both of San Jose; Clifford B. Willis, Tracy, all of Calif.

[73] Assignee: Sun Microsystems, Inc., Mountain View, Calif.

[21] Appl. No.: 551,774

[22] Filed: Nov. 7, 1995

[51] Int. Cl.⁶ .................................. H05K 5/00; H05K 7/14
[52] U.S. Cl. ..................... 361/802; 361/756; 361/759; 361/801; 439/64
[58] Field of Search ......................... 361/726, 732, 361/740, 741, 746, 756, 759, 801, 802; 439/64, 153, 377; 211/41

[56] References Cited

U.S. PATENT DOCUMENTS

| | | | |
|---|---|---|---|
| 3,954,242 | 5/1976 | Yoda | 248/223 |
| 5,393,234 | 2/1995 | Yamada et al. | 439/62 |
| 5,511,986 | 4/1996 | Casey et al. | 439/188 |
| 5,544,006 | 8/1996 | Radloff et al. | 361/683 |

Primary Examiner—Michael W. Phillips
Assistant Examiner—Jayprakash N. Gandhi
Attorney, Agent, or Firm—Blakely Sokoloff Taylor & Zafman

[57] ABSTRACT

A card guide that both restrains an installed electronic card and allows the card to be inserted into a computer chassis in a direction that is parallel to the motherboard of the computer. The card guide extends from a beam that is cantilevered from a frame of a computer chassis. The card guide has a groove that guides an edge of the electronic card so that the card is aligned with a connector of the motherboard. The card guide also has a ramp that guides the card into the groove in a direction parallel with the motherboard and perpendicular to the groove. The card is installed by initially pushing the electronic card along the ramp until the edge of the card snaps into the groove. The cantilevered beam is deflected by the installation force of the user to allow the card to move down the ramp. Once in the groove the electronic card is pushed in a direction perpendicular to the motherboard to plug the card into the motherboard connector. A corner of the installed electronic card is restrained from movement by a ramped portion of the groove. The electronic card is removed from the chassis by sliding the card corner along the ramped portion. The movement of the corner up the ramped portion deflects the beam so that the electronic card can be removed from the chassis in a direction parallel with the motherboard.

12 Claims, 2 Drawing Sheets

CARD GUIDE WITH GROOVE HAVING A BASE PORTION AND RAMPED PORTION WHICH RESTRAINS AN ELECTRONIC CARD

BACKGROUND OF THE INVENTION

1. Field of the Invention

The present invention relates to a card guide that guides and restrains an electronic card within a computer chassis.

2. Description of Related Art

Computers typically contain a plurality of electronic cards that are plugged into a motherboard. The cards and motherboard are located within a computer chassis. The electronic cards have an electrical connector that is mated with a corresponding connector mounted to the motherboard. To insure that the connectors are correctly mated, the walls of the chassis typically have guide rails that guide the electronic cards into the chassis and align the connectors.

As shown in FIG. 1, prior art computer chassis 1 contain slots 2 that align the electronic cards 3 with a motherboard 4. Prior art computers require an access space that is at least the length of the electronic card, so that the card can be pulled away from the chassis. This requirement provides a limitation on where the computer can be used in one's home or office. Additionally, having a computer chassis that requires the electronic cards to be pulled the length of the card, prevents other components and assemblies from being installed in the computer adjacent to the cards. It would be desirable to provide a computer chassis that would allow an electronic card to be removed without requiring an access space that is approximately the length of the card.

A computer may be subjected to external shock and vibration loads, particularly when shipped from the manufacturing site. Shock and vibration loads may damage the electronic cards. For this reason it is desirable to mechanically secure the cards to the chassis when the computer is transported and handled. Conventional card securing mechanism include various latches and levers. Such devices require manipulation by the end user and increase the cost of the electronic assembly. It would be desirable to provide a computer chassis that both minimizes access space and secures an electronic card to the chassis when the card is inserted into the computer.

SUMMARY OF THE INVENTION

The present invention is a card guide that both restrains an installed electronic card and allows the card to be inserted into a computer chassis in a direction that is parallel to the motherboard of the computer. The card guide extends from a beam that is cantilevered from a frame of a computer chassis. The card guide has a groove that guides an edge of the electronic card so that the card is aligned with a connector of the motherboard. The card guide also has a ramp that guides the card into the groove in a direction parallel with the motherboard and perpendicular to the groove. The card is installed by initially pushing the electronic card along the ramp until the edge of the card snaps into the groove. The cantilevered beam is deflected by the installation force of the user to allow the card to move down the ramp. Once in the groove the electronic card is pushed in a direction perpendicular to the motherboard to plug the card into the motherboard connector. A corner of the installed electronic card is restrained from movement by a ramped portion of the groove. The electronic card is removed from the chassis by sliding the card corner along the ramped portion. The movement of the corner up the ramped portion deflects the beam so that the electronic card can be removed from the chassis in a direction parallel with the motherboard, thus minimizing the access space required to remove the card.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 2:
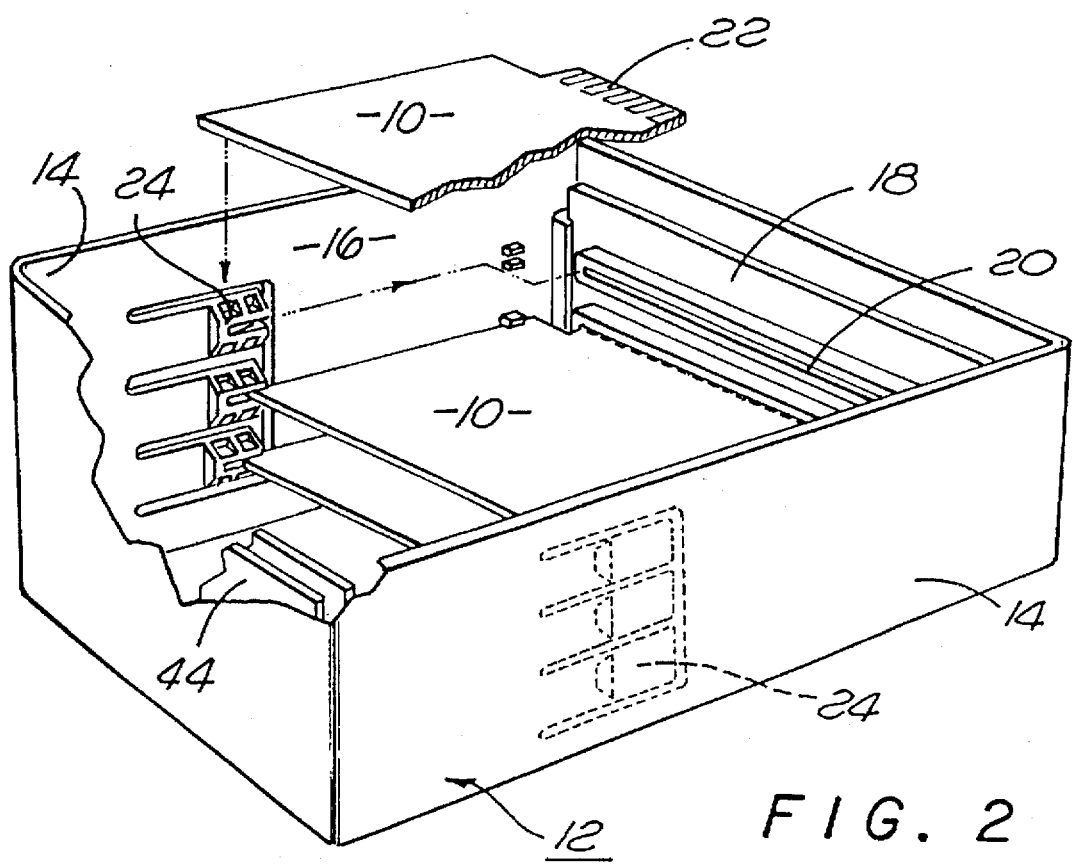
FIG. 2 is a perspective view of an electronic card and a computer chassis of the present invention.

Referring to the drawings more particularly by reference numbers, FIG. 2 shows a plurality of electronic cards 10 that are plugged into a computer chassis 12. The chassis 12 includes a pair of walls 14 that define a chassis opening 16. Located within the opening 16 is a motherboard 18. The motherboard 18 has a plurality of connectors 20 that can be mated with a connector portion 22 of the electronic card 10.

Figure 1:
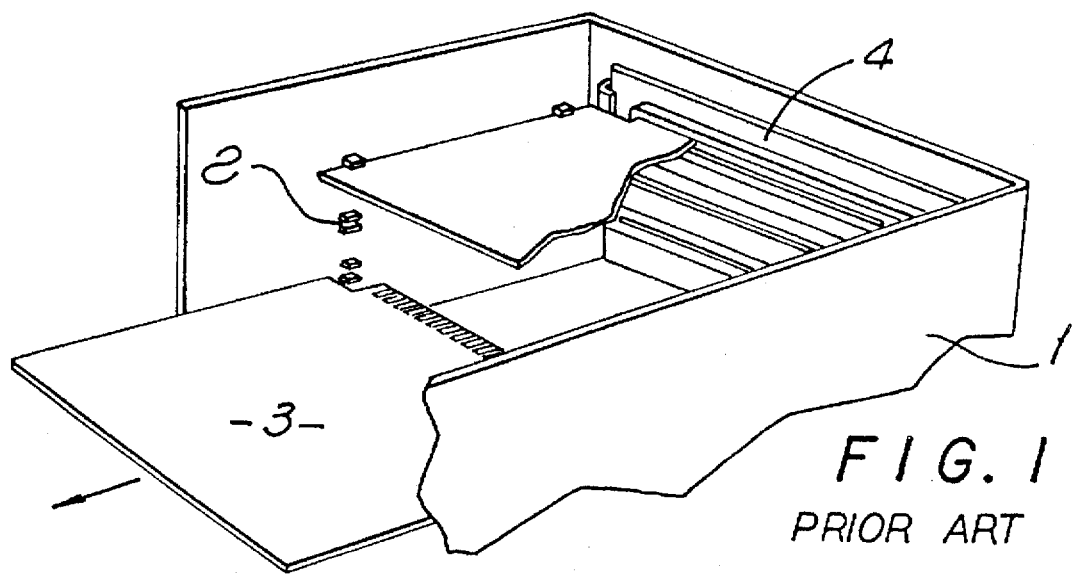
FIG. 1 is a perspective view showing an electronic card being removed from a computer chassis of the prior art.

Each wall 14 of the chassis 12 has a plurality of guide rails 24 that align and guide the card 10 into a motherboard connector 20. The guide rails 24 allow the electronic card 10 to be inserted into the card opening 16 in a direction that is parallel with the motherboard 18. This is to be distinguished from conventional computer assemblies, as shown in FIG. 1, wherein the card is inserted in a direction that is perpendicular to the motherboard. The guide rails 24 of the present invention also restrain the movement of a card 10 installed into the chassis 12.

Figure 3:
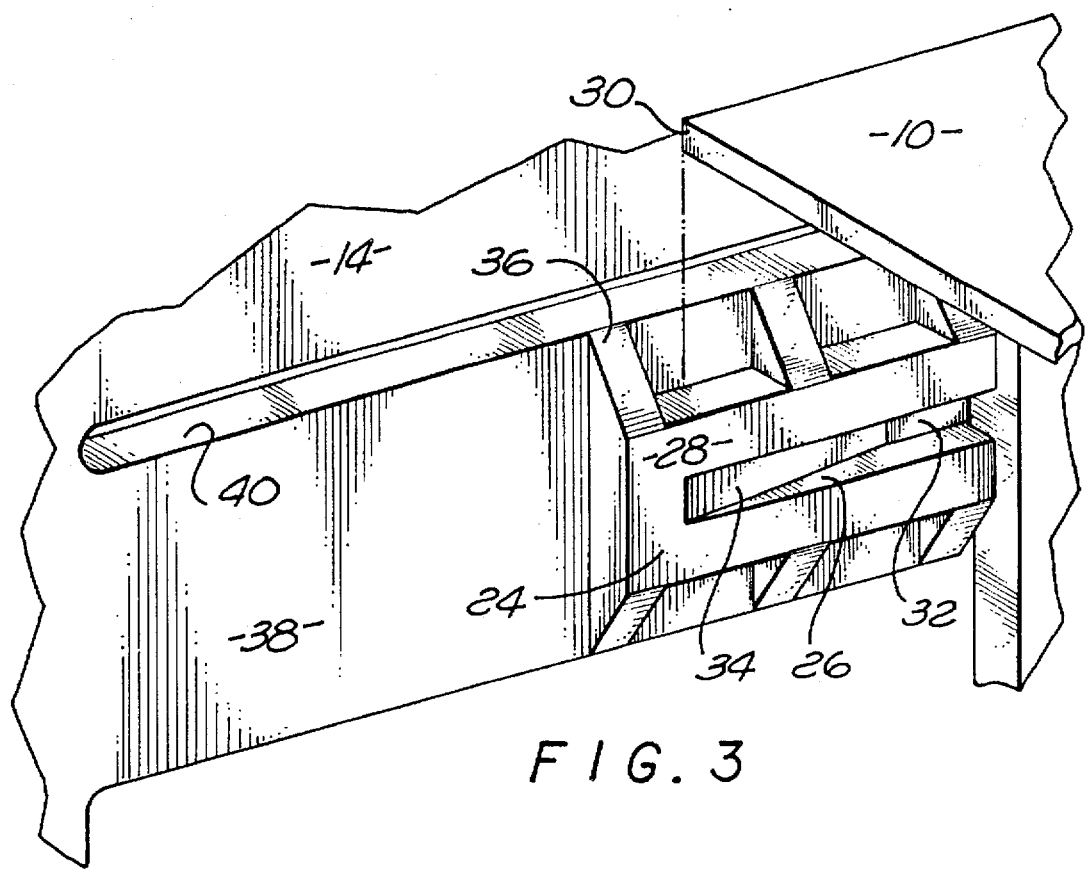
FIG. 3 is an enlarged perspective view of a card guide of the chassis.

As shown in FIG. 3, each guide rail 24 has a groove 26 that extends across a outer surface 28 of the rail 24 in a direction that is essentially perpendicular to the motherboard. The groove 26 receives an edge 30 of the electronic card 10 and aligns the card 10 with a motherboard connector 20. The groove 26 has a flat straight portion 32 and a tapered ramped portion 34. When the electronic card 10 is installed into the chassis 12 the ramped portion 34 restrains the movement of the card 10.

The guide rail 24 also has a tapered ramp 36 that guides the electronic card 10 into the groove 26 in a direction that is perpendicular to the longitudinal axis of the groove 26 and parallel to the motherboard 18. Each guide rail 24 is attached to a beam 38 that is cantilevered from a wall 14 of the chassis 12. In the preferred embodiment the beams 38 are formed by slots 40 in the chassis wall 14. The cantilevered beams 38 are deflected when the card 10 is pushed down the ramp 36 of the guide rail 24. Additionally, the beams 38 are also deflected when the card 10 is pulled away from the motherboard 18 and up the ramped portion 34 of the groove 26. The guide rails 24 are preferably integrally molded with the chassis walls 14 from a molded plastic material that has a relatively low friction coefficient.

Figure 4:
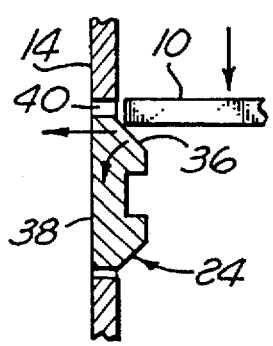
FIG. 4 is a side sectional view showing an electronic card being inserted into the chassis in a direction parallel with the motherboard of the computer.
Figure 5:
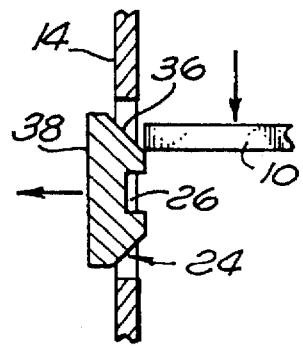
FIG. 5 is a view similar to FIG. 4 showing the electronic card sliding down a ramp of the card guide.
Figure 6:
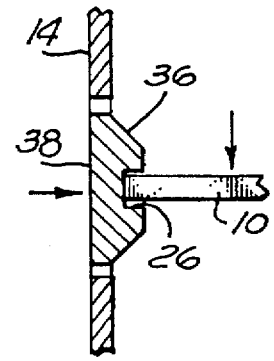
FIG. 6 is a view similar to FIG. 4 showing the electronic card within a groove of the card guide.

FIGS. 4–6 shows an electronic card 10 being installed into the chassis 12. The card 10 is initially located adjacent to a pair of guide rails 24 and pushed down the ramps 36 by the end user of the computer. The downward force on the card 10 is transferred into the oblique surfaces of the ramps 36. The transferred forces have a vector that is parallel with the beams 38 and a vector that is perpendicular to the beams 38. The perpendicular forces push the guide rails 24 and deflect the beam 38 away from the card 10. The deflection of the beams 38 allows the card 10 to travel down the tapered ramps 36 and into the grooves 26. The beams 38 deflect back to the original positions when the card snaps into the grooves 26. When the electronic card 10 is within the grooves 26 the end user can push the card 10 into a motherboard connector 20 in a direction perpendicular to the motherboard 18.

Figure 7:
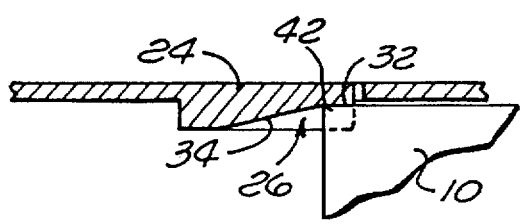
FIG. 7 is a top sectional view showing the electronic card in a plugged position.

As shown in FIG. 7, when the card 10 is plugged into the motherboard, the outer corners 42 of the card 10 are adjacent to the interface between the straight 32 and ramped 34 portions of the grooves 26. The ramped portions 34 impede movement of the card away from the motherboard and provide a means to restrain the installed card 10. Therefore a shock load applied along the longitudinal axis of the electronic card 10 will not move the card 10 and induce an undesirable separation of the card connector 22 from the motherboard connector 20.

Figure 8:
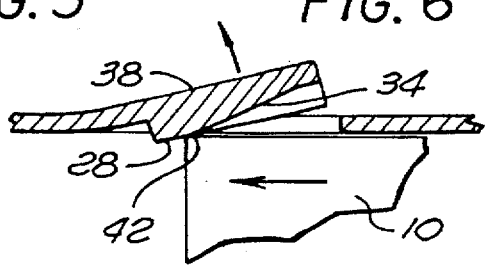
FIG. 8 is a top sectional view showing the electronic card being pulled out of the chassis.

As shown in FIG. 8, the electronic card 10 is detached from the motherboard by pulling the card 10 along the grooves 26. The ramped portions 34 transfer perpendicular forces that push the guide rails 24 and deflect the beams 38 away from the card 10. The electronic card 10 is pulled along the grooves 26 until the edges 30 are adjacent to the outer surfaces 28 of the guide rails, wherein the card 10 can then be pulled across the outer surfaces 28, up the ramps 36 and out of the chassis 12 in a direction parallel with the motherboard 18.

Referring to FIG. 2, by installing the electronic card 10 primarily in a direction parallel with the motherboard 18, the assembly does not requires as much clearance space to insert and remove the card as computer assemblies of the prior art. The reduction in clearance space allows a secondary board assembly 44 to be located adjacent to the electronic card 10. The parallel movement of the card allows the card to be removed without interfering with the secondary assembly 44. The guide rails 24 and cantilevered beams 38 of the present invention allow an electronic card 10 to be installed into a computer chassis in a direction that is parallel with a motherboard, and secure the card 10 within the chassis.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A card guide for an electronic card which has an edge and a corner, wherein the electronic card is inserted into a chassis, comprising:

a card guide which has a groove that receives the edge of the electronic card and guides the electronic card into the chassis, said groove having a base that includes a straight portion and a ramped portion that tapers from said straight portion to an outer surface, wherein the corner of the electronic card resides within said straight portion and is restrained by said ramped portion of said groove in a direction essentially parallel with the edge of the electronic card.

2. The card guide as recited in claim 1, wherein said card guide extends from a beam that is deflected when the corner is moved along said ramped portion of said groove.

3. The card guide as recited in claim 1, wherein said card guide has a ramp that guides the electronic card in a direction essentially perpendicular to said groove.

4. The card guide as recited in claim 3, wherein said card guide extends from a beam that is deflected when the electronic card is moved along said ramp and said ramped portion of said groove.

5. A card guide for an electronic card that has an edge, wherein the electronic card is inserted into a chassis, comprising:

a card guide which has a groove that receives the edge of the electronic card and guides the electronic card into the chassis, said card guide further having a ramp that tapers from an outer surface to a base of said card guide so said ramp guides the electronic card into said groove in a direction essentially perpendicular to a longitudinal axis of said groove.

6. The card guide as recited in claim 5, wherein said card guide extends from a beam that is deflected when the electronic card is moved along said ramp.

7. A computer chassis that contains an electronic card that is coupled to a motherboard, wherein the electronic card has a pair of edges and a pair of corners, comprising:

a pair of opposing walls that define an opening that receives the electronic card, each wall having a card guide which has a groove that receives an edge of the electronic card and guides the electronic card into the motherboard, each groove having a base that includes a straight portion and a ramped portion that tapers from said straight portion to an outer surface, wherein the corners of the electronic card reside within said straight portions and are restrained by said ramped portion of said grooves in a direction essentially parallel with the edge of the electronic card.

8. The chassis as recited in claim 7, wherein each card guide extends from a beam cantilevered from one of said walls, said beams are deflected when the electronic card is moved along said ramped portion of said grooves.

9. The chassis as recited in claim 7, wherein each card guide has a ramp that guides the electronic card into said groove in a direction essentially perpendicular to said groove.

10. The chassis as recited in claim 9, wherein each card guide extends from a beam cantilevered from one of said walls, said beams are deflected when the electronic card is moved along said ramps of said card guides and said ramped portions of said grooves.

11. A computer chassis that contains an electronic card that is coupled to a motherboard, wherein the electronic card has a pair of edges, comprising:

a pair of opposing walls that define an opening that receives the electronic card, each wall having a card guide which has a groove that receives and edge of the electronic card and guides the electronic card into the motherboard, each card guide has a ramp that tapers from an outer surface to a base of said card guide so said ramp guides the electronic card into said groove in a direction essentially perpendicular to a longitudinal axis of said groove and parallel with the motherboard.

12. The chassis as recited in claim 11, wherein each card guide extends from a beam cantilevered from one of said walls, said beams are deflected when the electronic card is moved along said ramp.

* * * * *